United States Patent [19]

Fujita et al.

[11] 4,113,981

[45] Sep. 12, 1978

[54] ELECTRICALLY CONDUCTIVE ADHESIVE CONNECTING ARRAYS OF CONDUCTORS

[75] Inventors: Masanori Fujita, Matsudo; Sukenori Suzuki, Narashino, both of Japan

[73] Assignee: Kabushiki Kaisha Seikosha, Japan

[21] Appl. No.: 751,730

[22] Filed: Dec. 17, 1976

Related U.S. Application Data

[62] Division of Ser. No. 602,446, Aug. 6, 1975, abandoned.

[30] Foreign Application Priority Data

Aug. 14, 1974 [JP] Japan .................................. 49/93080
Aug. 14, 1974 [JP] Japan .................................. 49/93082

[51] Int. Cl.² ...................... H02G 15/08; H01R 5/02; H01B 1/00
[52] U.S. Cl. ................. 174/88 R; 174/94 R; 252/511; 252/514
[58] Field of Search ................. 174/88 R, 84 R, 94 R; 252/511, 514, 513

[56] References Cited

U.S. PATENT DOCUMENTS

| | | | |
|---|---|---|---|
| 3,157,735 | 11/1964 | Stroup et al. | 174/94 R |
| 3,334,040 | 8/1967 | Conrad et al. | 252/511 X |
| 3,359,145 | 12/1967 | Salyer et al. | 252/513 X |
| 3,475,213 | 10/1969 | Stow | 252/511 X |
| 3,677,974 | 7/1972 | Kilduff | 252/514 |
| 3,692,702 | 9/1972 | Lania et al. | 252/511 |
| 3,725,308 | 4/1973 | Ostolski | 252/514 X |
| 3,884,840 | 5/1975 | Romanski et al. | 252/511 |

FOREIGN PATENT DOCUMENTS 4,997,843 9/1974 Japan.

*Primary Examiner*—Thomas J. Kozma
*Attorney, Agent, or Firm*—Robert E. Burns; Emmanuel J. Lobato; Bruce L. Adams

[57] ABSTRACT

An electrically conductive adhesive comprises electrically conductive particles mixed in a non-conductive base at such a mixing ratio that the conductive particles are not in contact with one another. When this adhesive is disposed between facing electrodes, it provides electric conductivity between the facing electrodes but maintains electric insulation in the lateral direction.

5 Claims, 7 Drawing Figures

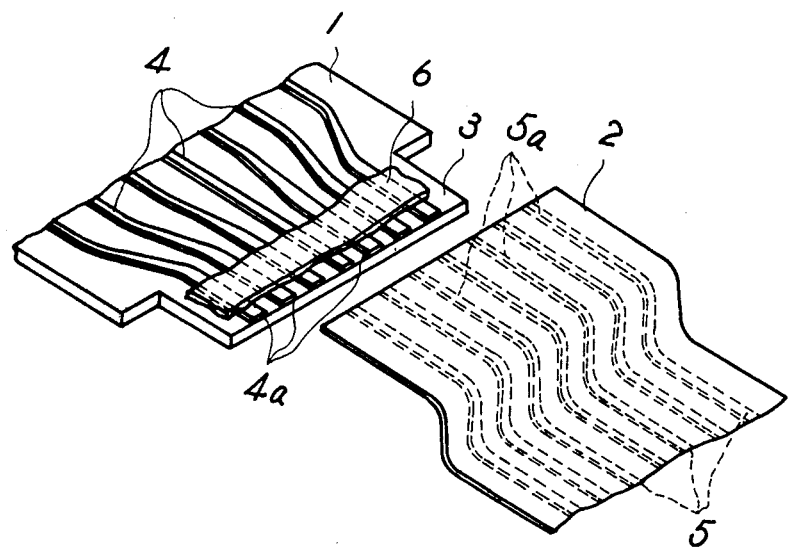
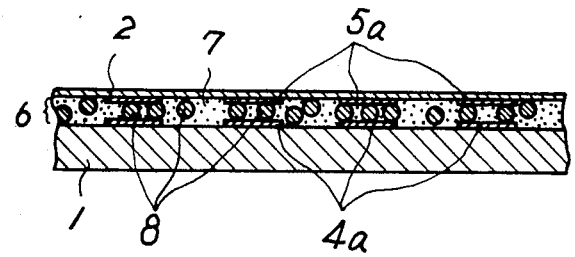

ELECTRICALLY CONDUCTIVE ADHESIVE CONNECTING ARRAYS OF CONDUCTORS

This is a divisional of application Ser. No. 602,446, filed Aug. 6, 1975, now abandoned.

This invention relates to an electrically conductive adhesive.

In the connection of electric circuits with lead-in wires, for example, connection of large scale integrated circuits (LSI) with printing plates and the connection of external connection terminals of various devices with flat cables, especially when connection terminals are arranged at a very low pitch, close attention should be paid to whether connection is performed by soldering or by using an electrically conductive adhesive. Accordingly, in conventional methods, this connection operation requires much time and labor, and the manufacturing cost of the intended products is very high. Therefore, it is difficult to provide products of high quality in large quantities at low costs.

Further, in any of the conventional conductive adhesives used in this field, electrically conductive particles are incorporated at such a high mixing ratio that the conductive adhesive is electrically conductive in any direction. Therefore, the proportion of the adhesive base, such as an epoxy type adhesive, is reduced, and a problem is brought about in connection with the adhesion strength.

This invention aims at overcoming the foregoing defects and disadvantages involved in the conventional techniques.

In accordance with the fundamental aspect of this invention, there is provided an electrically conductive adhesive comprising a non-conductive base and electrically conductive particles incorporated into said non-conductive base in such a state that the particles are not in contact with one another at all.

It is a primary object of this invention to provide a novel adhesive that can provide electric conductivity in one direction between two facing members but does not provide electric conductivity in the lateral direction.

Another object of this invention is to provide an electrically conductive adhesive which can render facing members electrically conductive with each other assuredly and at a high efficiency.

Still another object of this invention is to provide a sheet-like electrically conductive adhesive which can provide electric conductivity between facing members but does not allow electric conduction in the lateral direction.

The foregoing and other objects of this invention will be apparent from the following description and claims by reference to the accompanying drawings, in which:

FIG. 1 is a developed perspective view illustrating an embodiment where an instance of the adhesive of this invention is used for connection of a flat cable to a printing plate;

FIG. 2 is an enlarged view illustrating the connection state;

Figure 3:
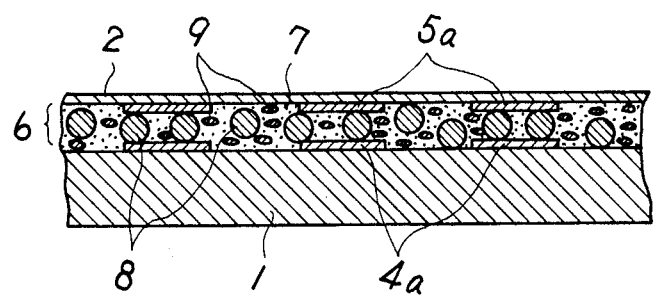
FIG. 3 is an enlarged sectional view illustrating another embodiment where another instance of the adhesive of this invention is used for electric connection.

The adhesive of this invention comprises a non-conductive base and electrically conductive particles incorporated in the non-conductive base. As the conductive particles, there can be employed, for example, carbon powder, SiC powder and metal powder such as reduced Ag powder, Au powder, Pd/Ag powder, Ni powder and In powder. It is preferred that the conductive particles have the substantially same spherical shape and diameter. The upper limit of the mixing ratio of the conductive particles is about 60% by volume. When the mixing ratio of the conductive particles is lower than 60% by volume, if it is used for connecting two facing members, the electric conductivity is manifested in the facing direction alone and the connected assembly is electrically non-conductive in the lateral direction. The mixing ratio referred to in the present invention is one as determined when the non-conductive base is in the solidified state. In case a non-conductive adhesive is of such a kind that a solvent or the like is evaporated on solidification, the mixing ratio of the conductive particles is determined based on the solidified non-conductive base and this mixing ratio is adjusted below 60% by volume based on the total volume in the solidified state. In general, when the proportion of the conductive particles is about 30% by volume, the value of the electric resistance in the lateral direction begins to be lowered and when the amount of the conductive particles is about 60% by volume, a substantial conductivity is manifested also in the lateral direction, though this tendency varies to some extent depending on the shape of the conductive particles actually employed. Accordingly, it is preferred that the mixing ratio of the conductive particles be lower than about 30% by volume.

In order to improve the electric conductivity between facing members or the insulating property in the lateral direction, insulating particles or electrically conductive fine particles having a scale-like shape may be incorporated in the non-conductive base together with the above-mentioned conductive particles.

Embodiments where the electrically conductive adhesive of this invention is used for electric connection will now be described in order to illustrate this invention more detailedly.

Referring now to FIGS. 1 and 2, a printing plate 1 is connected with a flat cable 2 by using the conductive adhesive of this invention. One end portion of the printing plate 1 is formed as a junction 3 where an array of connecting terminals 4a of a printed circuit 4 is disposed. An array of corresponding terminals 5a of a film conductor 5 is formed on the flat cable 2. A pasty, electrically conductive adhesive 6 according to this invention is thinly coated on the junction 3 of the printing plate 1, and the cable 2 is piled or superposed on the plate 1, following which the assembly is press-bonded. By curing of the electrically conductive adhesive 6, the printing plate 1 is bonded to the flat cable 2 in the state as shown in FIG. 2. In FIG. 2, reference numeral 7 denotes a non-conductive base of the electrically conductive adhesive 6, and reference numeral 8 denotes electrically conductive particles incorporated in the base 7. As is seen from FIG. 2, connecting terminals 4a and 5a are electrically connected with each other through the conductive particles 8, but no short circuit is formed in the lateral direction between two adjoining terminals. As pointed out hereinabove, the critical mixing ratio of the conductive particles for retaining a substantial non-conductivity in the lateral direction is about 60% by volume, and the conductive particles 8 are incorporated in an amount below this critical mixing ratio. The mixing ratio of the conductive particles 8 is determined within this range appropriately depending on the shape and size of the conductive particles 8 and the width and pitch of the connecting terminals 4a and 5a. In short, the mixing ratio is determined within the above range so that at least one electrically conductive particle is present between opposed facing members to be electrically connected with each other.

In the embodiment shown in FIG. 3, electrically conductive fine particles 9 are incorporated in the non-conductive base 7 together with electrically conductive particles 8, whereby the conductivity in the vertical or thickness direction is highly improved. It is preferred that the electrically conductive fine particles 9 have a scale-like shape of a thickness of several $\mu m$, and the material constituting the conductive fine particles 9 is appropriately selected from the same members as mentioned above with respect to the electrically conductive particles 8. The size of the electrically conductive fine particles is determined appropriately depending on the diameter of the conductive particles 8 and the clearance between facing members to be connected, and it is generally preferred that the size of the conductive fine particles 9 is about 1/10 of the diameter of the electrically conductive particles 8. The conductive fine particles 9 may be incorporated in an amount of up to 30% by volume, but a care should be taken so that no conductivity is manifested in the lateral direction.

Figure 4:
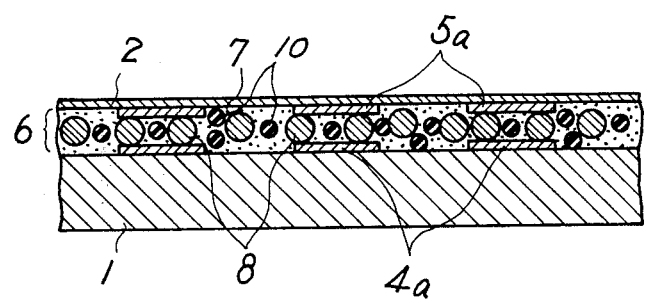
FIG. 4 is an enlarged sectional view illustrating still another embodiment where still another instance of the adhesive of this invention is used for electric connection.

In the embodiment shown in FIG. 4, insulating particles 10 are incorporated together with the electrically conductive particles 8, whereby the non-conductivity in the lateral direction is improved. As the insulating particle 10, there are employed metal oxide powder such as $Al_2O_3$ powder, $Y_2O_3$ powder and SiO powder, inorganic powder such as $MgF_2$ powder, $CaCO_3$ powder and glass powder, and organic powder such as plastic powder. It is preferred that the size of the insulating particles 10 be smaller than the diameter of the electrically conductive particles 9. The mixing ratio of the insulating particles 10 is determined depending on the desired insulating resistance, and it is generally preferred that the insulating particles 10 be incorporated at such a mixing ratio that insulating particles 10 are present among conductive particles 8 to prevent the particles 8 from being contacted with one other.

An embodiment where the electrically conductive adhesive of this invention is used in a sheet-like form will now be described.

Figure 5:
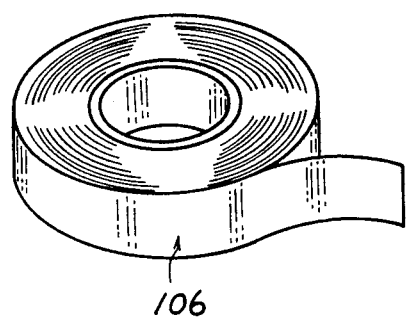
FIG. 5 is a perspective view showing a sheet-like adhesive of this invention in the rolled state.
Figure 6:
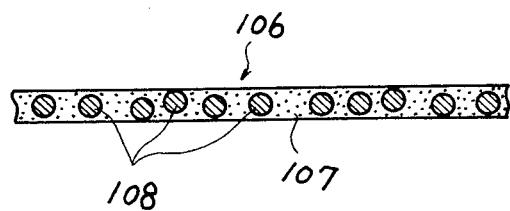
FIG. 6 is an enlarged sectional view of the sheet-like adhesive shown in FIG. 5.

Referring now to FIG. 6, a sheet-like electrically conductive adhesive 106 of this invention comprises a non-conductive base 107 and electrically conductive particles 108 separated from one another by the base 107, and it is shaped into a sheet-like form having a thickness substantially equal to the diameter of the conductive particles 108. This sheet-like adhesive 106 in the rolled state is shown in FIG. 5. When this sheet-like adhesive 106 is prepared, as the non-conductive base 107 there is employed a material which is electrically insulating and is molten under heating, for example, a hot-melt adhesive or a thermoplastic resin. As specific examples of such material, there can be mentioned polyethylene terephthalate (Myler), polyethylene fluoride (Teflon), an acrylic resin and polyamide (nylon).

An embodiment where this sheet-like electrically conductive adhesive is used will now be described to illustrate this invention more detailedly.

More specifically, an embodiment where the sheet-like electrically conductive adhesive of this invention is molded into a shape determined depending on the intended use will now be described by reference to connection of a printing plate to LSI.

Figure 7:
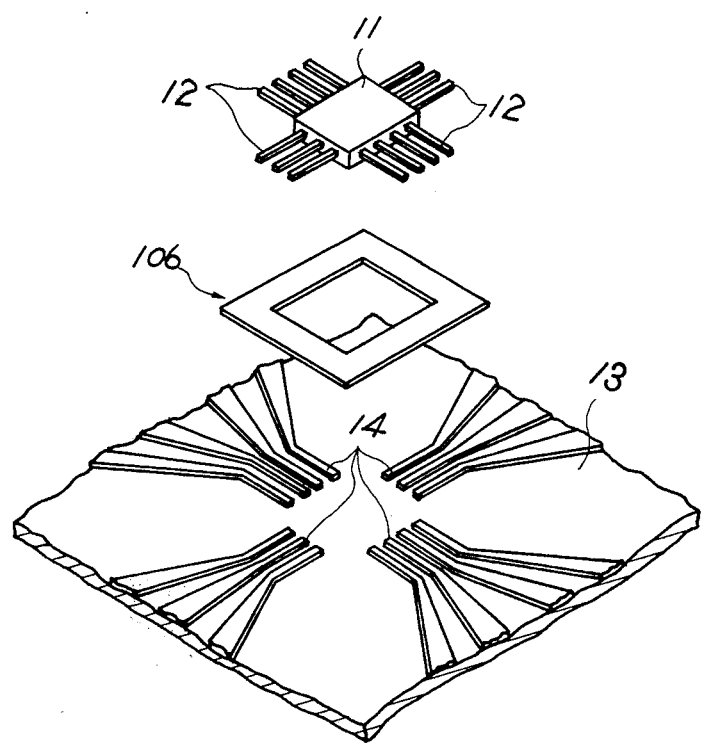
FIG. 7 is a developed perspective view illustrating an embodiment where a printing plate is connected with LSI by using the sheet-like adhesive of this invention.

Referring now to FIG. 7, LSI 11 has connecting terminals 12, and a printing plate 13 has conductors 14 printed thereon which are to be connected with terminals 12 of the LSI 11. A sheet-like electrically conductive adhesive 106 which is formed by punching so that it has a punched-out open space corresponding to the periphery 10 of the LSI is placed on the prescribed position of the printing plate 13, and the LSI 11 is placed thereon so that the terminals 12 of the LSI 11 are in registry with corresponding conductors 14. In this state, the non-conductive base 107 is heated until molten and compressed by using suitable means, and when the non-conductive base 107 is solidified, connection of the printing plate 13 and LSI 11 is accomplished. Thus, mechanical bonding is attained between facing conductors 14 and terminals 12 by the non-conductive base 107, and simultaneously, the conductors 14 and the terminals 12 are electrically connected through the electrically conductive particles 108. Of course, since the conductive particles 108 are not contacted with one another, no short circuit is caused among the terminals.

What we claim is:

1. An assembly comprising: a pair of members each having an array of electric conductors thereon, said members having respective portions thereof in superposed spaced-apart relationship such that terminal portions of the array of electric conductors on one member face respectively terminal portions of the array of electric conductors on the other member; and means adhering together said pair of members to electrically connect facing terminal portions of both arrays of electric conductors and electrically insulate adjoining terminal portions of both arrays of electric conductors, said means comprising an electrically non-conductive adhesive material adhering together said pair of members, and electrically conductive particles incorporated and mixed in said adhesive material, said particles being disposed in essentially a single layer and having a size sufficiently large with respect to the spacing distance between said members to electrically connect said facing terminal portions of both arrays of electric conductors, and said particles being spaced apart by said adhesive material distances sufficient to electrically insulate adjoining terminal portions of both arrays of electric conductors.

2. An assembly according to claim 1; wherein said particles all have substantially the same spherical shape and diameter.

3. An assembly according to claim 2; wherein said particles are present in said adhesive material in a mixing ratio no greater than about 60% by volume.

4. An assembly according to claim 1; further including electrically conductive fine particles incorporated in said adhesive material and having a size smaller than that of said electrically conductive particles.

5. An assembly according to claim 1; further including insulating particles incorporated in said adhesive material and having a size smaller than that of said electrically conductive particles.

* * * * *